United States Patent
Condemi et al.

(10) Patent No.: US 6,452,864 B1
(45) Date of Patent: Sep. 17, 2002

(54) INTERLEAVED MEMORY DEVICE FOR SEQUENTIAL ACCESS SYNCHRONOUS READING WITH SIMPLIFIED ADDRESS COUNTERS

(75) Inventors: Carmelo Condemi, Gravina; Fabrizio Campanale, Bari; Salvatore Nicosia, Palermo; Francesco Tomaiuolo, Monte Sant'Angelo; Luca Giuseppe De Ambroggi, Catania; Promod Kumar, Motta S. Anastasia, all of (IT)

(73) Assignee: STMicroelectonics S.R.L., Agrate Brianza (IT)

( * ) Notice: Subject to any disclaimer, the term of this patent is extended or adjusted under 35 U.S.C. 154(b) by 0 days.

(21) Appl. No.: 09/774,539

(22) Filed: Jan. 31, 2001

(30) Foreign Application Priority Data

Jan. 31, 2000 (EP) .............................. 00830068
May 30, 2000 (IT) ........................ VA00A0015

(51) Int. Cl.⁷ ................................. G11C 8/00
(52) U.S. Cl. .................... 365/233; 365/230.04
(58) Field of Search ................ 365/233, 239, 365/230.03, 189.02, 189.08, 235, 230.04

(56) References Cited

U.S. PATENT DOCUMENTS

| | | | |
|---|---|---|---|
| 5,247,644 A | * 9/1993 | Johnson et al. ............. 395/425 |
| 5,453,957 A | * 9/1995 | Norris et al. ........... 365/230.04 |
| 5,497,355 A | * 3/1996 | Mills et al. ............. 365/230.08 |
| 5,559,990 A | 9/1996 | Cheng et al. ................ 395/484 |
| 5,596,539 A | 1/1997 | Passow et al. ............... 365/210 |
| 5,696,917 A | 12/1997 | Mills et al. .................. 395/401 |
| 5,886,930 A | * 3/1999 | Maclellan et al. ...... 365/189.05 |
| 5,966,724 A | 10/1999 | Ryan ........................... 711/105 |
| 6,031,785 A | * 2/2000 | Park et al. ............. 365/230.08 |

FOREIGN PATENT DOCUMENTS

| EP | 0561370 | 9/1993 | ............. G11C/7/00 |
| EP | 0961283 | 12/1999 | ............. G11C/7/00 |

* cited by examiner

Primary Examiner—Richard Elms
Assistant Examiner—Hien Nguyen
(74) Attorney, Agent, or Firm—Lisa K. Jorgenson; Allen, Dyer, Doppelt, Milbrath & Gilchrist, P.A.

(57) ABSTRACT

An interleaved memory includes an array of memory cells divided into a first bank of memory cells and a second bank of memory cells. The interleaved memory operates in a burst access mode. A first address counter is coupled to the first bank of memory cells, and an address register is coupled to the first address counter and to the second bank of memory cells. A timing circuit generates increment pulses to the first address counter so that a first random access asynchronous read cycle starts with the first bank of memory cells. A function of an address counter for the second bank of memory cells is being performed by coping contents of the first address counter to the address register.

9 Claims, 5 Drawing Sheets

INTERLEAVED MEMORY DEVICE FOR SEQUENTIAL ACCESS SYNCHRONOUS READING WITH SIMPLIFIED ADDRESS COUNTERS

FIELD OF THE INVENTION

The present invention relates in general to memory devices, and, in particular, to an interleaved memory device readable in a synchronous mode for successive locations with a sequential or burst access mode.

BACKGROUND OF THE INVENTION

Interleaved memory devices with a sequential (or burst) access mode comprises at least two banks of memory cells provided with their own address counter and independent decoding and sensing circuits. The array of memory cells may be subdivided in any number of blocks greater than two.

A typical simplified diagram of an interleaved memory device is depicted in FIG. 1. In a synchronous interleaved memory organized in two banks, the successive addresses of the respective banks at which the read operations must be alternately carried out are sequentially generated automatically by incrementing internal address counters in synchronization with an external clock. This is after a first random access to a certain location on one of the two banks based upon the acquisition of an externally commanded address (first asynchronous read cycle). The management of sequential read operations may be designed for any number of banks by reading the different banks according to a scheme while always incrementing the address of the previous location.

The fact that an interleaved memory is most commonly divided in two half-arrays or banks of cells allows for a new read cycle to be started on a bank while the read cycle on the other bank has not yet terminated, thus saving time. In order to do this it is essential that address operations to the two banks be independent from each other.

To maintain synchronization of the interleaved memory, increments for the address counter for the respective banks (EVEN/ODD) must be carried out according to whether the start address for a new sequential or burst access synchronous read phase pertains to the even or the odd bank. Also, it may pertain to a certain pre-established bank in case of a number of banks N>2, according to the particular protocol used for managing the memory device. The start address is externally acquired and starts the first random access asynchronous read cycle.

In the most typical case of a two-bank interleaved memory, as may be observed in FIGS. 2 and 3, in a burst mode the read cycles successive to the first one are time interleaved between the banks $ODD_{13}$ BANK and $EVEN_{13}$ BANK. The increments of the address counters $EVEN_{13}$ COUNTER and $ODD_{13}$ COUNTER are controlled by two distinct incrementing clocks, labeled with $INC_{13}$ EVEN and $INC_{13}$ ODD in FIG. 4. This is produced by a control logic circuit that controls the timing of a synchronous read phase.

According to the known technique, each of the internal address counters of the respective half-arrays or banks is an N-th binary counter formed by N bistable stages, typically flip-flops, and N half-adder stages connected in cascade. Each half-adder stage has a carry bit input CARRY for the carry bit coming from the preceding stage and an address input coming from its associated flip-flop.

In such binary counters the propagation chain of the signal CARRY determines the maximum operating speed. In the propagation chain of the commonly used binary counters, carry bits are produced by ANDing the address bit and the carry bit coming from the previous stage. This imposes a wait for the propagation of signals throughout the N-1 stages in order to receive the information concerning the carry bit of the N-th stage. Such a propagation scheme implies wait times that often are not compatible with a high operating speed, especially in counters having a large number of stages.

SUMMARY OF THE INVENTION

In view of the foregoing background, it is an object of the present invention to provided an approach that addresses the slowness in generating addresses for the banks of an interleaved memory during a sequential access synchronous read phase.

This and other objects, advantages and features are provided by the fact that, differently from the common interleaved memory devices, only one internal address binary counter of one bank is used, while the function of an internal address counter of any other bank is performed by a common register in which it is copied the content (the internal address) of the binary counter of the first bank or of the content (the internal address) of the respective register of the bank that immediately precedes the considered bank according to the sequential read cycle scheme for all the memory banks, starting from the first one.

According to a preferred embodiment of the invention, each stage of the single internal address counter of one of the two banks is functionally coupled to a corresponding stage of the internal address register of the bank that follows it in the cycle succession of the sequential read of the data. The data is read from the different banks through a pass-gate that is switched to a conduction state by each increment pulse. Similarly, each stage (latch) of the register that follows the counter is coupled to the corresponding stage (latch) of the register that follows it in the succession through a pass-gate that is switched in a conduction state by each increment pulse.

BRIEF DESCRIPTION OF THE DRAWINGS

The different aspects and advantages of the invention will become even more evident through a detailed description of the invention referring to the attached drawings in which.

Detailed Description of the Preferred Embodiments

Figure 1:
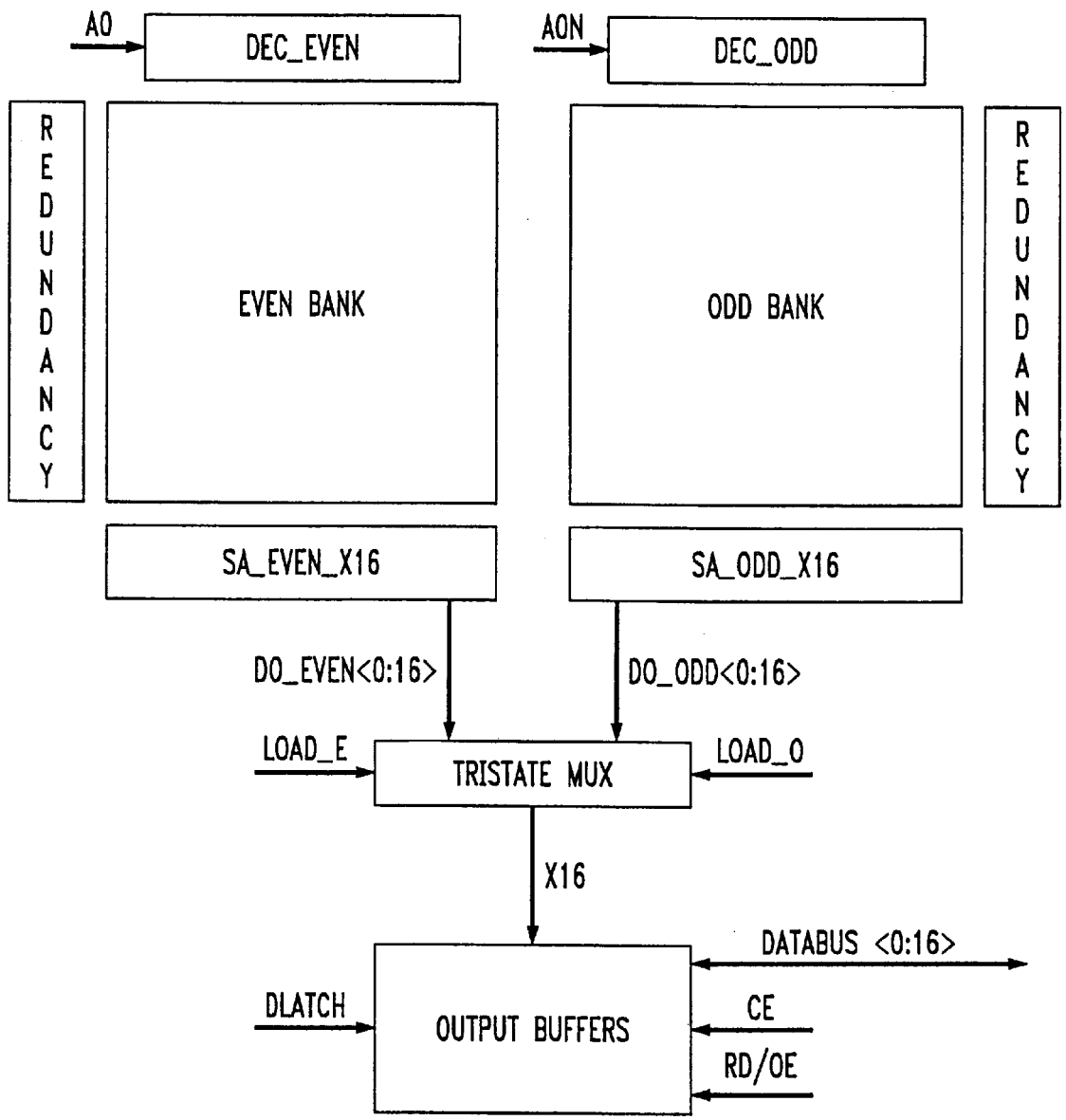
FIG. 1 is a basic diagram of an interleaved memory device according to the prior art.
Figure 2:
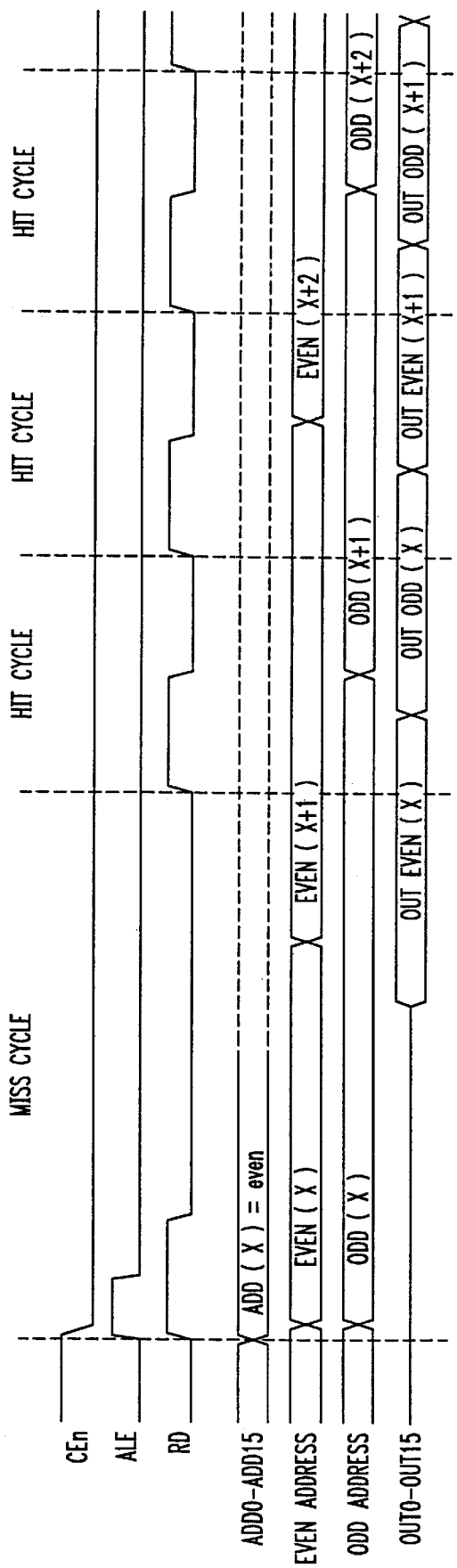
FIGS. 2 and 3 are timing diagrams of the main signals involved in accessing the banks of an interleaved memory device according to the prior art.
Figure 3:
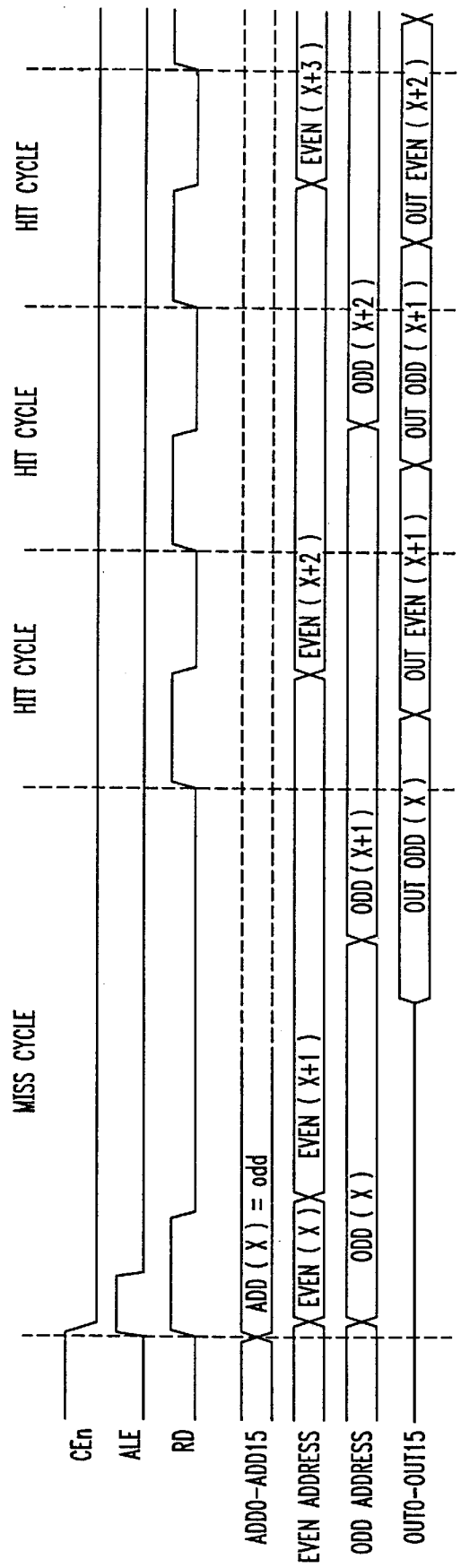
Figure 4:
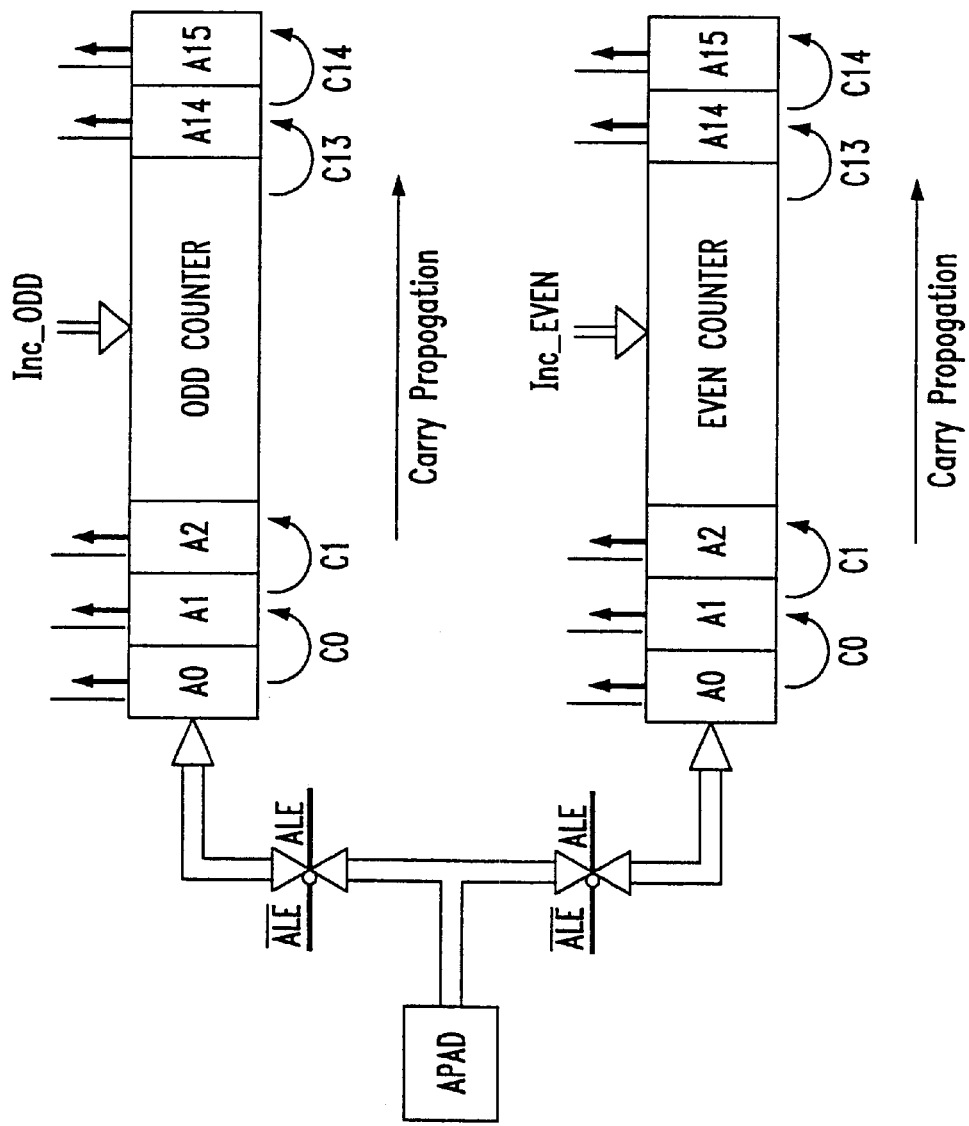
FIG. 4 depicts the architecture of a common address counter for an interleaved memory according to the prior art.

For purposes of illustrating the present invention, reference will be made to a common interleaved memory device split in only two banks (half-matrices). The central point of the invention is the fact that, as it may be noticed from FIGS. 2 and 3, there is always a bank, which in the considered case is the bank $EVEN_{13}$ BANK, whose counter receives first the address increment. When the counter $EVEN_{13}$ COUNTER is incremented, the successive increment of the counter $ODD_{13}$ COUNTER produces exactly the same address stored in the counter $EVEN_{13}$ COUNTER.

It has been found that in an interleaved memory device it is not necessary to use as many binary counters as the number of banks. Instead, the function of all the other binary counters except a first one may be advantageously performed by simply using registers.

Figure 5:
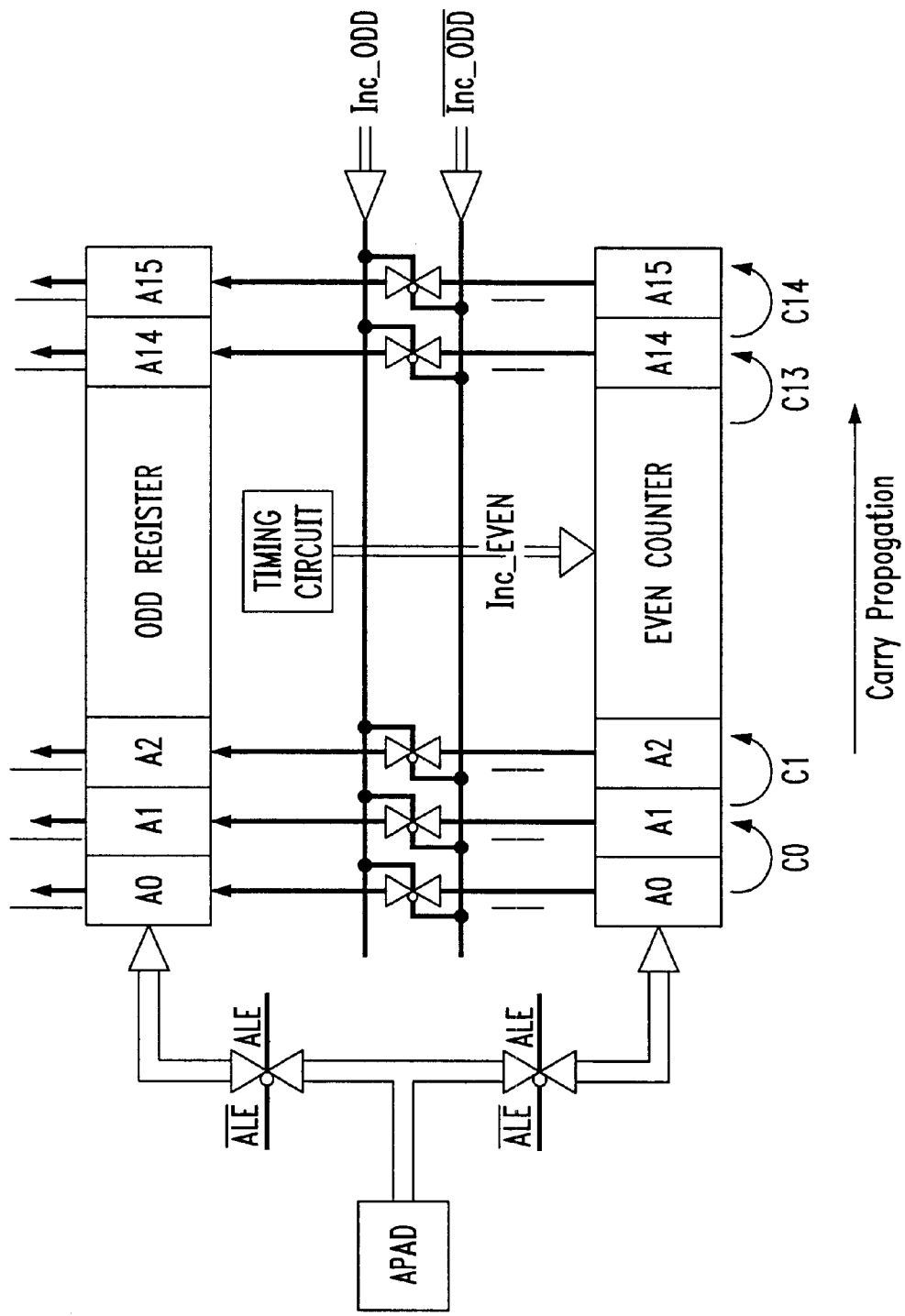
FIG. 5 depicts the architecture of the address counter of the memory according to the present invention.

An architecture for producing addresses for the two banks of a burst memory device of the invention is depicted in FIG. 5.

On the bank $EVEN_{13}$ BANK, the current address is pointed by a standard binary counter $EVEN_{13}$ COUNTER, while on the other bank $ODD_{13}$ BANK the address is pointed by a register $ODD_{13}$ REGISTER in which the content of the binary counter of the bank $EVEN_{13}$ BANK is copied as it is produced.

According to a preferred embodiment of the invention, the stages of the counter are coupled to respective stages of the register through pass-gates driven by the increment clock $INC_{13}$ ODD. This causes the content of the counter $EVEN_{13}$ COUNTER to be stored into the register $ODD_{13}$ REGISTER at each clock pulse. A significant hardware simplification is thus advantageously obtained because the number of components used to form a register is smaller than that necessary to form a binary counter.

Moreover, the address for the bank $ODD_{13}$ BANK is updated in a shorter time than the time required to increment a binary counter. In fact, when the address of the bank $ODD_{13}$ BANK is updated (incremented) it is no longer necessary to wait for the propagation time of the carry because the new address is more rapidly obtained by copying the content of the counter $EVEN_{13}$ COUNTER. The diagram of FIG. 5 does not introduce any limitation or functional difference with respect to a classic realization with two binary counters, and may be conveniently used in all burst access interleaved memory devices.

Even in the case of a memory with a number of banks (N) greater than two, after having defined a first bank as reference bank, the control circuit of the memory device carries out the successive burst readings in a cycle by incrementing the addresses of the various banks in succession up to the N-th bank. Should the (asynchronously) addressed bank at each first read phase of a burst access cycle not be the first bank (reference bank) but the K-th (1<K<N) bank, the memory timing circuit effects the successive increments of the addresses from the K-th to the N-th bank, and thereafter, points again to the first bank.

In practice, only the pre-defined first bank, from which the burst readings start will be provided with an address counter while all the other banks will have address registers functionally interconnected as in the above described example of an interleaved memory device with only two banks.

That which is claimed is:

1. An interleaved memory comprising:
   an array of memory cells divided into a first bank of memory cells and a second bank of memory cells, the interleaved memory operating in a burst access mode;
   a first address counter coupled to said first bank of memory cells;
   an address register coupled to said first address counter and to said second bank of memory cells;
   a timing circuit for generating increment pulses to said first address counter so that a first random access asynchronous read cycle starts with said first bank of memory cells; and
   a function of an address counter for said second bank of memory cells being performed by copying contents of said first address counter to said address register.

2. An interleaved memory device according to claim 1, wherein said first address counter and said address register each comprises a plurality of stages; and wherein the interleaved memory further comprises a plurality of pass-gates coupled between respective stages of said first address counter and said address register.

3. An interleaved memory device according to claim 2; wherein said plurality of pass-gates are switched to a conduction state at each increment pulse.

4. An interleaved memory comprising:
   an array of memory cells divided into a first bank of memory cells and a second bank of memory cells;
   a first address counter coupled to said first bank of memory cells and comprising a plurality of stages;
   a plurality of pass-gates coupled to said plurality of stages;
   an address resister comprising a plurality of stages coupled to said plurality of stages of said first address counter;
   a timing circuit for generating increment pulses to said plurality of pass-gates; and
   a function of an address counter for said second bank of memory cells being performed by copying contents of said first address counter to said address register.

5. An interleaved memory device according to claim 4, wherein a first random access asynchronous read cycle starts with said first bank of memory cells.

6. An interleaved memory device according to claim 4, wherein said plurality of pass-gates are switched to a conduction state at each increment pulse.

7. An interleaved memory device according to claim 4, wherein the interleaved memory operates in a burst access mode.

8. A method for generating addresses in an interleaved memory operating in a burst access mode, the interleaved memory comprising an array of memory cells divided into a first bank of memory cells and a second bank of memory cells, a first address counter coupled to the first bank of memory cells, and an address register coupled to the first address counter and to the second bank of memory cells, the method comprising:
   generating increment pulses to the first address counter so that a first random access asynchronous read cycle starts with the first bank of memory cells; and
   copying contents of the first address counter to the address register so that a function of an address counter for the second bank of memory cells is performed.

9. A method according to claim 8, wherein the first address counter and the address register each comprises a plurality of stages, and the interleaved memory further comprising a plurality of pass-gates coupled between the respective stages of the first address counter and the address register; the method further comprising switching the plurality of pass-gates to a conduction state at each increment pulse.

* * * * *

UNITED STATES PATENT AND TRADEMARK OFFICE
CERTIFICATE OF CORRECTION

PATENT NO. : 6,452,864 B1
DATED : September 17, 2002
INVENTOR(S) : Carmelo Condemi et al.

It is certified that error appears in the above-identified patent and that said Letters Patent is hereby corrected as shown below:

Column 1,
Line 53, delete "$ODD_{13}BANK$ and $EVEN_{13}$" insert -- ODD_BANK and EVEN_ --
Line 54, delete "$EVEN_{13}$" insert -- EVEN_ --
Line 55, delete "$ODD_{13}COUNTER$" insert -- ODD_COUNTER --
Line 56, delete "$INC_{13}EVEN$" insert -- INC_EVEN --
Line 57, delete "$INC_{13}ODD$" insert -- INC_ODD --

Column 2,
Line 63, delete "$EVEN_{13}BANK$" insert -- EVEN_BANK --
Lines 64 and 67, delete "$EVEN_{13}$ COUNTER" insert -- EVEN_COUNTER --
Line 66, delete "$ODD_{13}COUNTER$" insert -- ODD_COUNTER --

Column 3,
Lines 9 and 13, delete "$EVEN_{13}BANK$" insert -- EVEN_BANK --
Lines 10 and 31, delete "$EVEN_{13}$ COUNTER" insert -- EVEN_COUNTER --
Lines 11, 25 and 28, delete "$ODD_{13}BANK$" insert -- ODD_BANK --
Lines 12 and 20, delete "$ODD_{13}REGISTER$" insert -- ODD_REGISTER --
Line 19, delete "$INC_{13}ODD$" insert -- INC_ODD --
Line 19, delete "$EVEN_{13}$" insert -- EVEN_ --
Lines 37-38, delete "as reference" insert -- as a reference --

Signed and Sealed this

Eighteenth Day of March, 2003

JAMES E. ROGAN
*Director of the United States Patent and Trademark Office*